United States Patent [19]

Glunz

[11] Patent Number: 5,502,661

[45] Date of Patent: Mar. 26, 1996

[54] CHECKING DESIGN FOR TESTABILITY RULES WITH A VHDL SIMULATOR

[75] Inventor: Wolfgang Glunz, Munich, Germany

[73] Assignee: Siemens Aktiengesellschaft, Munich, Germany

[21] Appl. No.: 132,821

[22] Filed: Oct. 7, 1993

[30] Foreign Application Priority Data

Oct. 15, 1992 [EP] European Pat. Off. .............. 92117650

[51] Int. Cl.$^6$ ...................................................... G06F 11/00
[52] U.S. Cl. .......................................... 364/578; 371/22.1
[58] Field of Search ............................ 371/23; 364/578, 364/488, 490, 491

[56] References Cited

PUBLICATIONS

Proc. 14th ACM/IEEE Design Automation Conf., 1977, H. C. Godoy et al "Automatic Checking of Logic Design Structures for Compliance with Testability Ground Rules", pp. 469–478.
Proc. 29th ACM/IEEE Design Automation Conference, Jun., 1992, pp. 305–310, Pelz, "An Interpreter for General Netlist Design Rule Checking".
International Test Conference, 1990, pp. 222–234, Kenneth P. Parket et al "A Language for Describing Boundary–Scan Devices".
20th Design Automation Conference, IEEE 1983, pp. 300–307, Dilip K. Bhavsar, "Design for Test Calculus: An Algorithm for DFT Rules Checking".
IEEE Design & Test of Computers, 1991 IEEE, pp. 50–57 Mehrdad Bidjan–Irani, "A Rule–Based Design–for–Testability Rule Checker".
IEEE 1989, pp. 38–41, J. Lawrence Carter et al, "Restricted Symbolic Evaluation is Fast and Useful".
IEEE Design & Test of Computers, 1990, Joanne E. Degroat, "Transparent Logic Modeling in VHDL", pp. 42–48.
IEEE Transactions on Circuits and Systems, CAS–26, Sep., 1979, pp. 685–693, Lawrence H. Goldstein, "Controllability/Observability Analysis of Digital Circuits".
Proceedings of the International Conference on Computer Design, 1990, pp. 95–98, Koseko et al "Rule–Based Testability Rule Check Program".
Proceedings of the European Test Conference (ETC), 1989, R. Knopf and E. Trischler, "Cerberus: A Hierarchical DFT Rule Checker", pp. 58–62.
Proceedings of the 29th ACM/IEEE Design Automation Conference 1992, pp. 305–310, G. Pelz, "An Interpreter for General Netlist Design Rule Checking".
International Conference on VLSI, 1989, pp. 143–153, W. Roth et al, "The Bed Concept—A Method and a Language for Modular Test Generation".
Proceedings of the International Test Conference, 1990, pp. 1055–1064, P. Varma, "TDRC—A Symbolic Simulation Based Design for Testability Rules Checker".
Proceedings of the 22nd ACM/IEEE Design Automation Conference, 1985, pp. 204–211, H. J. Wunderlich, "Protest: A Tool for Probabilistic Testability Analysis".

Primary Examiner—Ellis B. Ramirez
Assistant Examiner—Edward Pipala
Attorney, Agent, or Firm—Hill, Steadman & Simpson

[57] ABSTRACT

Application of VHDL simulators to check the conformance of a design with Design for Testability (DFT) rules. A special DFT logic using VHDL's powerful logic modeling capabilities is defined and a kind of symbolic simulation based on this DFT logic is performed.

2 Claims, 7 Drawing Sheets

```
--Phase 1
  -- set MuxCtrl for transfer of 0
  MuxCtrl  <= (false,'0',1,NOW); --MuxCtrl has pin number 1
  -- apply one clock cycle
  Clock    <= (false,'1',2,NOW); -- Clock has pin number 2
  wait for 4 ns;
  Clock    <= (false,'0',2,NOW);
  wait for 4 ns;
  -- apply datain (for input A of ALU) and set AluCtrl to Addition
  -- time T1;
  DataIn   <= (true ,'0',3,NOW); --DataIn has pin number 3
  AluCtrl  <= (false,'1',4,NOW); --AluCtrl has pin number 4
  -- set MuxCtrl for transfer of ALU output
  MuxCtrl  <= (false,'1',1,NOW);
  -- apply one clock cycle
  Clock    <= (false,'1',2,NOW);
  wait for 4 ns;
  Clock    <= (false,'0',2,NOW);
  wait for 4 ns;
  -- now the value for the A input of the ALU has reached the ALU
  -- apply datain (for B input of ALU)
  -- time T2;
  DataIn   <= (true ,'0',3,NOW);
  AluCtrl  <= (true ,'0',4,NOW); -- now it is symbolic !!
--Phase 2
  -- The ALU should now check its inputs and provide the symolic output values
  check_mut(1) <= true; -- the ALU has the MUT-Id 1
  wait for 0; -- send the event to the ALU
--Phase 3
  -- now transport the outputs of the ALU to external outputs
  -- this phase is trivial in this example.
  -- now check the outputs.
  Assert (DataOut.symbolic = true) and (dataout.sigref = 101) report
  "DataOut does not carry the symbolic value of the ALU output"
  severity NOTE;
```

FIG 2

```
library IEEE1164;
use IEEE1164.std_logic_1164.all;
package dft_logic is
   constant n_clocks:Natural:= 2;
   type symbolictype       is (data,clock,dontcare);
   type clockdependtype    is (not_dep,
                               dep_inv,
                               dep_nor);
   type clockdependvector is array(1 to n_clocks)
                              of clockdependtype;
   type dft_logic_sync     is record
      symbolic     : symbolictype;
      sigvalue     : std_logic;
      clockdepend  : clockdependvector;
      prot_phase_1: boolean;
      prot_phase_2: boolean;
   end record;
   signal protocol_phase1 : boolean;
   signal protocol_phase2 : boolean;
   function "and" (L,R : dft_logic_sync)
                    return dft_logic_sync;
       .
       .
       .
END dft_logic;
```

FIG 3

```
-- Phase 1
   Clock1.symbolic         <= clock;
   Clock1.sigvalue         <= '0';
   Clock1.clockdepend(1)   <= dep_nor;
   Clock2.symbolic         <= clock;
   Clock2.sigvalue         <= '0';
   Clock2.clockdepend(1)   <= dep_nor;
   wait for 100 ns;
-- Phase 2
   assertion false report "Protocol Phase 1"
                   severity NOTE;
   protocol_phase1         <=   true;
   In1.prot_phase1         <=   true;
   In2.prot_phase1         <=   true;
   Clock1.prot_phase1      <=   true;
   Clock2.prot_phase1      <=   true;
   wait for 100 ns;
-- Phase 3
   assertion false report "Protocol Phase 2"
                   severity NOTE;
   protocol_phase2         <=   true;
   In1.prot_phase2         <=   true;
   In2.prot_phase2         <=   true;
   Clock1.prot_phase2      <=   true;
   Clock2.prot_phase2      <=   true;
   wait;
```

```
library IEEE1164;
use IEEE1164.std_logic_1164.all;
package BED_logic is
   type dft_logic_bed is record
      symbolic : boolean;
      sigvalue : std_logic;
      sigref   : Natural;
      timeref  : time;
   end record;
end BED_logic;
```

```
--Phase 1
  -- set MuxCtrl for transfer of 0
  MuxCtrl  <= (false,'0',1,NOW);   -- MuxCtrl has pin number 1
  -- apply one clock cycle
  Clock    <= (false,'1',2,NOW);   -- Clock has pin number 2
  wait for 4 ns;
  Clock    <= (false,'0',2,NOW);
  wait for 4 ns;
  -- apply datain (for input A of ALU) and set AluCtrl to Addition
  -- time T1;
  DataIn   <= (true ,'0',3,NOW);   -- DataIn has pin number 3
  AluCtrl  <= (false,'1',4,NOW);   -- AluCtrl has pin number 4
  -- set MuxCtrl for transfer of ALU output
  MuxCtrl  <= (false,'1',1,NOW);
  -- apply one clock cycle
  Clock    <= (false,'1',2,NOW);
  wait for 4 ns;
  Clock    <= (false,'0',2,NOW);
  wait for 4 ns;
  -- now the value for the A input of the ALU has reached the ALU
  -- apply datain (for B input of ALU)
  -- time T2;
  DataIn   <= (true ,'0',3,NOW);
  AluCtrl  <= (true ,'0',4,NOW);   -- now it is symbolic !!
--Phase 2
  -- The ALU should now check its inputs and provide the symolic output values
  check_mut(1) <= true;   -- the ALU has the MUT-Id 1
  wait for 0;  -- send the event to the ALU
--Phase 3
  -- now transport the outputs of the ALU to external outputs
  -- this phase is trivial in this example.
  -- now check the outputs.
  Assert (DataOut.symbolic = true) and (dataout.sigref = 101) report
  "DataOut does not carry the symbolic value of the ALU output"
  severity NOTE;
```

CHECKING DESIGN FOR TESTABILITY RULES WITH A VHDL SIMULATOR

BACKGROUND OF THE INVENTION

The standard hardware description language VHDL has so far mostly been used for simulation and synthesis in this context, users rarely define arbitrary logic types of their own either because synthesis tools do not support them or because simulation is done at levels where all data have simple bit or bit vector types. In this patent application, it is shown how VHDL's logic definition capabilities can be exploited to define special logic types based on which several testability related design rules can be checked with a VHDL simulator.

Several approaches to design rule checking have been published (GoFB77, Bhav83, KnTr89, KHOM90, Varm90, Bidj91, Pelz92). A good classification can be found in (Pelz92). While differing in the methods, all of these approaches except (GoFB77) need some special purpose tool to perform the checks. The goal of this invention is to tap standard simulation resources for rule checking, thus avoiding the need for a special purpose tool. The idea to check simple design rules with a standard logic simulator was already presented in (GoFB77). This procedure was very limited, though, since it had to use the standard logic provided by the simulator. Based on VHDL's flexibility, our new method makes performing significantly more complex checks feasible.

SUMMARY OF THE INVENTION

It is an object of the present invention to provide a method to check the conformance of a digital circuit design with a given set of testability rules which is more flexible than known methods, since it exploits the possibilities of user defined (non-standard) logic, and which, at the same time, can be applied by use of standard simulation tools like VHDL simulators.

According to the invention, a method is provided for checking conformance of a digital circuit design with a given set of testability design rules. A description of a circuit to be checked is built using a description language that permits use of a user-defined, non-standard logic. A circuit dependent sequence of stimuli is applied to the circuit description, the stimuli being based on a specially selected user defined logic which is selected in accordance with testability design rules to be checked. The stimuli through the circuit description is simulated until a stable state is reached using a simulator corresponding to the description language used. The stimulation model is switched into a check mode in which each component of the circuit checks a testability state and issues error messages if an illegal state was found.

DESCRIPTION OF THE PREFERRED EMBODIMENTS

In the following, the invention is described in more detail with reference to the figures and preferred embodiments of the invention.

First, in this application, the basic principles of the present approach are explained. Then the method will be elaborated in more detail demonstrating two different applications. Both of them check whether or not certain testability related design rules are obeyed in a circuit. The first rule set focuses on synchronous design whereas the second rule set is intended to support modular testing. In the final part, some possible extensions are presented.

Basic Principle

We assume a circuit description given in a subset of VHDL that comprises all structural and data flow statements of the language. Process statements are only allowed as long as they represent pure combinational logic. Sequential processes, however, can easily be converted to a set of Boolean equations (VHDL data flow) and basic flip-flops using standard synthesis tools. The basic principle of our approach is as follows:

1. Replace the original logic (e.g., bit and bit-vector) with a special DFT logic in the circuit description;
2. Apply certain stimuli based on this logic to the circuit description;
3. Simulate these stimuli through the design until a steady state is reached, i.e., until the VHDL simulator has no more events to process; and
4. Switch the model into a special "check mode" in which each component of the design checks its "DFT state" and issues error messages if an illegal state was found.

In the next two sections we explain the individual steps in the context of two different applications.

Checking Rules for Synchronous Design

One of the most important design rules to make automatic test pattern generation for digital circuits feasible is to keep the design synchronous. A synchronous design is not necessarily restricted to a single clock, but the clock inputs of all its storage cells should be controllable from external pins, possibly through some combinational logic (gating-logic). Controllable in this context means that clock input of a storage cell can be set to its inactive value from external pins. This condition guarantees that data signals cannot generate clock impulses.

Figure 1:
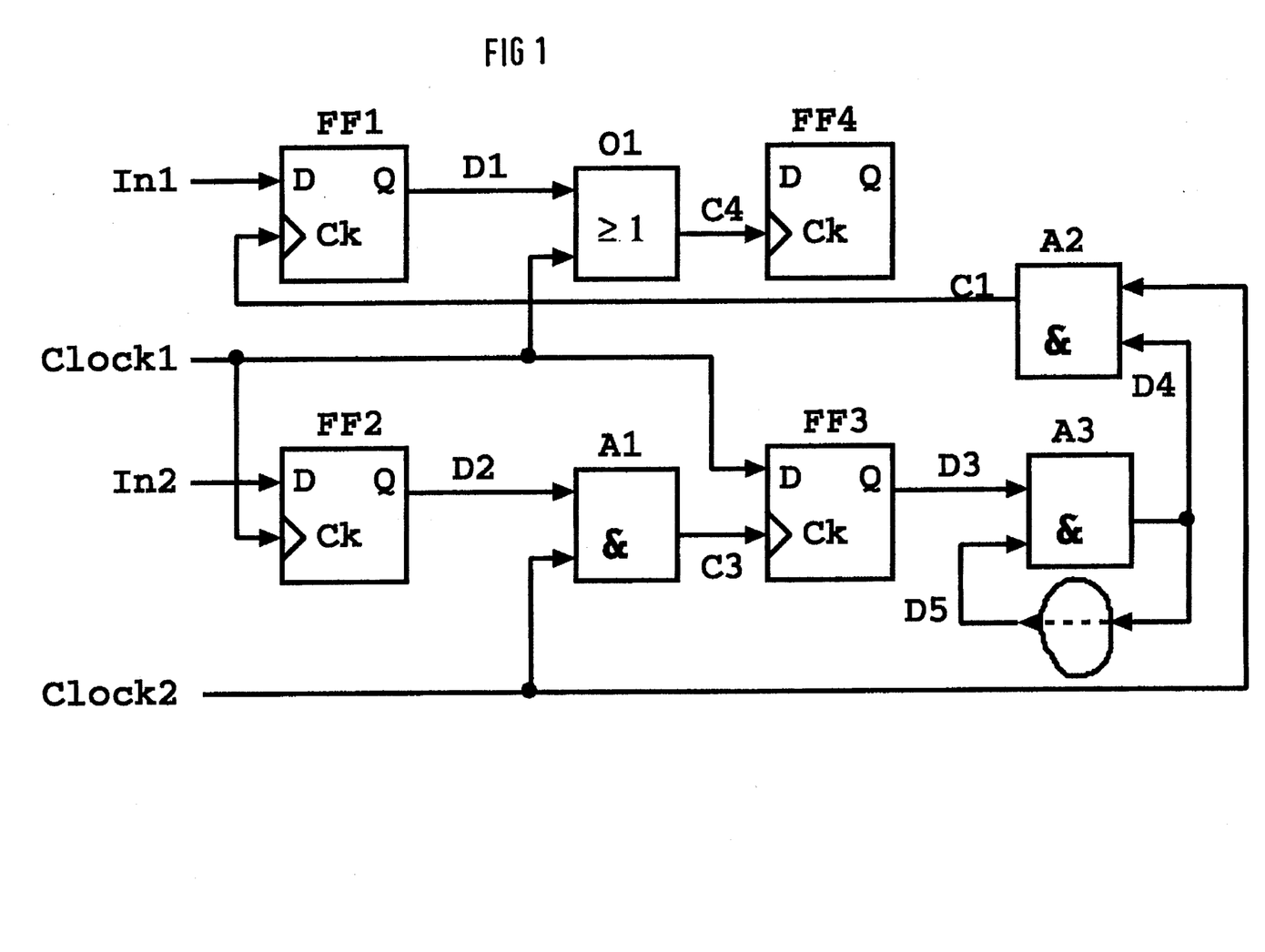
FIG. 1 shows a circuit diagram involving combinations between clock and data signals.

In FIG. 1 an example for a correct gating of a clock (D2 and Clock2) and two combinations of clocks and data signals that violate the rules for synchronous design are shown. ORing D1 and Clock1 is a violation since the data signal D1 may generate a clock edge for FF4. AND-ing D4 and Clock2 is a problem since D4 depends on Clock2 (the clock to be gated) via FF3 and A3. This situation can cause a shortened clock impulse for FF1 depending on the delay times of FF3 and A3. Additional problems in this circuit are that a clock signal (Clock1) is used as data input to flip-flop FF3 and a combinational feedback around gate A3.

Figure 2:
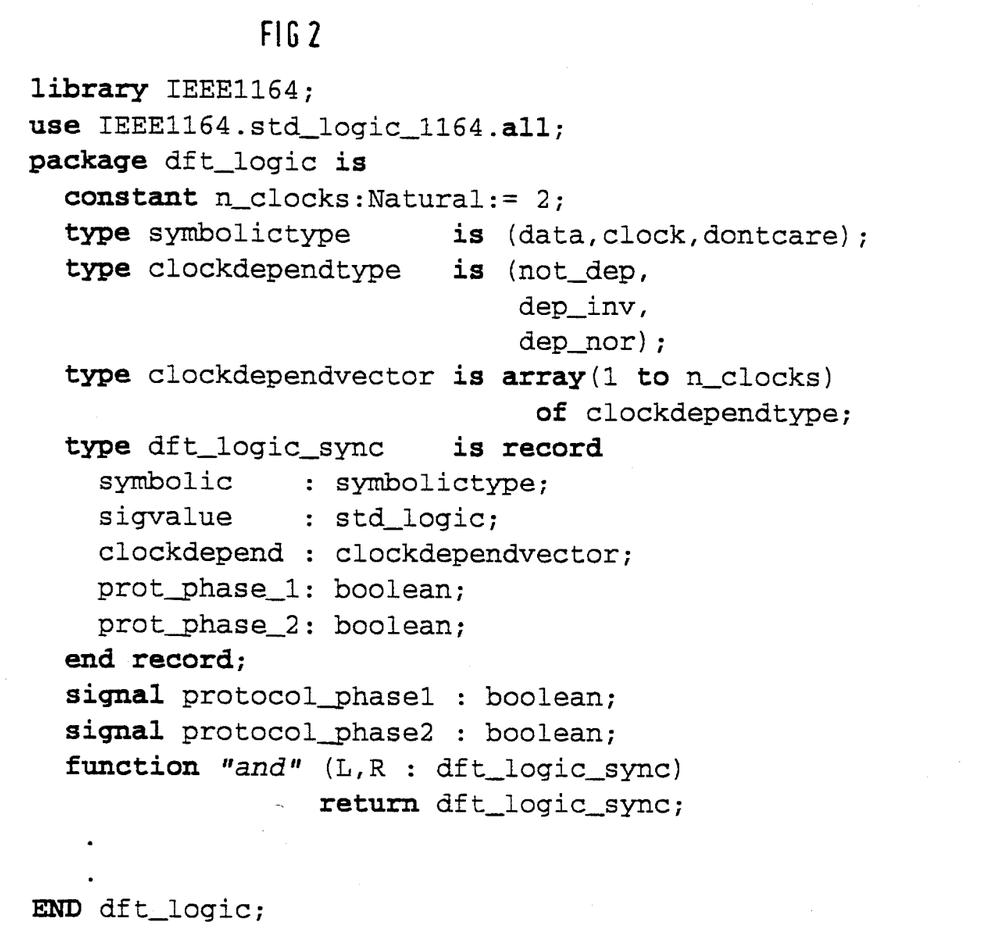
FIG. 2 shows the DFT-logic for rules for synchronous design that correspond to a preferred embodiment of the invention.

To check for such kinds of rule violation we introduce a new logic type in VHDL as shown in FIG. 2. The new logic is built on a record that contains the information whether a signal is a data or a clock signal in its first element symbolic. The element sigvalue has different meanings depending on the value of symbolic.

For clock signals only '0' and '1' are allowed in sigvalue which indicate an active rising or falling edge respectively. For data signals, the value is interpreted as usual. Normally all data signals carry the value 'U' (undefined) for this rule check, but certain data signals, e.g., for special test modes, might be assigned a fixed value of '0' or '1'. In the clockdepend array we mark the external clocks that a signal depends on. We distinguish between signals that are independent (not_dep) of any clock signals that are dependent from the rising edge (dep_nor) or falling edge (dep_inv) of one or more clocks. Clocks are all numbered from 1 to n_clocks. The prot_phase_1 and prot_phase_2 elements are used to control the reporting of error messages and are explained in more detail below.

In VHDL, all signals and variables get a defined initial value during simulation. For enumeration types, this value defaults to the leftmost value of the type if not explicitly specified otherwise. Hence, in our logic each signal has a default initial value of (data, 'U', (not_dep, ..., not_dep), false, false). For design for testability (DFT) rule checking we now simulate the circuit using the stimuli shown in FIG. 3.

Figure 3:
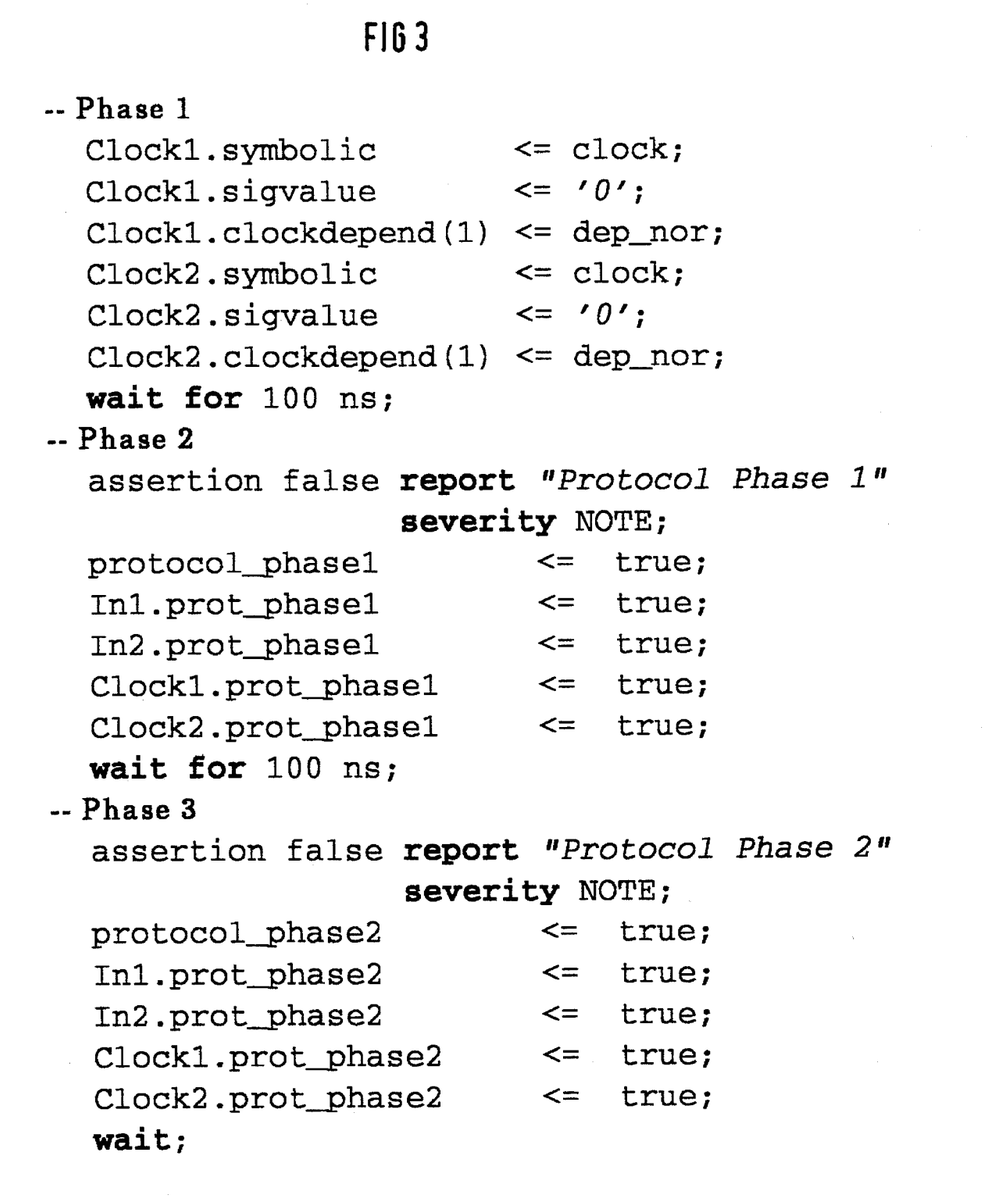
FIG. 3 shows stimuli for a DFT-rule check, corresponding to a simulation of a circuit like the circuit shown in FIG. 1.

Since we do not assign a value to them, the data inputs get the initial value described above. The VHDL simulator activates a function for each component in the design to calculate the output values as a function of the input values and local state of the component. The original component models do not work with the new logic, thus we need specific models for the DFT logic. To minimize this effort we have overloaded the standard operators like and, or, and not for the new logic. Thus, most models just have to be recompiled after exchange of the logic. This is further simplified if symbolic constante, e.g., one instead of '1', are used for fixed values as suggested in [Degr90] since we have defined such constants for the DFT logic, too.

The DFT rule check is performed in three phases. In the first phase the global signals protocol_phase1 and protocol_phase2 are false by default. All gates determine new values for their outputs whenever one of their input values has changed. Since the local state of a gate may change several times until a global steady state is reached the model does not issue an error message if it temporarily drops into an illegal state. When the simulation has reached a steady state we set the protocol_phase1 signal to true and the prot_phase1 element of all inputs to true. The storage elements are modeled such that they also set the prot_phase1 element of their outputs to true when the global signal protocol_phase1 is set to true. The new assignments trigger all components in the circuit at least once again. Since a component might be activated more than once, error messages are only issued if the prot_phase1 element of all inputs of a component is true.

The prot_phase1 element is only passed to the outputs of a component if it is true in all inputs. Thus, at the end of this phase only components contained in a combinational feedback loop or depending on signals whose driver is contained in such a feedback loop have one or more inputs with a prot_phase1 value of false. To find these components we then assign true to the global signal protocol_phase2 and to the prot_phase2 element of all primary inputs and the outputs of all storage elements. All components are triggered again and issue an error message if at least one of the prot_phase1 element of their inputs is false (from the previous phase). Thus, we can detect components contained in pure combinational feedback loops as a side effect.

At first glance it seems an overhead to store the protocol phase information both in a global signal and in every signal of the circuit. This is necessary, however, since we redefined the VHDL operators for the special logic and we want to perform checks inside overloaded operators, too. The problem is that a VHDL operator cannot be made sensitive to global signals. Hence, we have to pass the protocol phase to the operators via the operands.

When we simulate the example circuit with the above stimuli, we get the following state2 of the internal signals in protocol phase 1.

| D1 | (data, | 'U', | (not_dep,not_dep), | true, | false) |
|---|---|---|---|---|---|
| D2 | (data, | 'U', | (dep_nor,not_dep), | true, | false) |
| D3 | (data, | 'U', | (not_dep,dep_nor), | true, | false) |
| D4 | (data, | 'U', | (not_dep,dep_nor), | false, | false) |
| D5 | (data, | 'U', | (not_dep,dep_nor), | false, | false) |
| C1 | (dontcare, | 'U', | (not_dep,not_dep), | false, | false) |
| C3 | (clock, | 'O', | (not_dep,dep_nor), | true, | false) |
| C4 | (dontcare, | 'U', | (not_dep,not_dep), | true, | false) |

Due to this state the following error messages are issued by the model of the flip-flop and the basic operators used in the models of the and/or gates.

Assertion NOTE at 100 NS in design unit STIM from process/SYNCEX/STIMGEN: "Protocol Phase 1".

Assertion NOTE at 100 NS in design unit DFLIPFLOP from process /SYNCEX/B0/FFE/FF:

"A clock signal was found at the data input of a flip-flop."

Assertion NOTE at 100 NS in design unit OR_GATE from process/SYNCEX/B0/O1/_P0: "The inactive value of the clock is not dominant over the data it is combined with."

After simulation through the second protocol phase the circuit is in the following DFT state.

| D1 | (data, | 'U', | (not_dep,not_dep), | true, | true) |
|---|---|---|---|---|---|
| D2 | (data, | 'U', | (dep_nor,not_dep), | true, | true) |
| D3 | (data, | 'U', | (not_dep,dep_nor), | true, | true) |
| D4 | (data, | 'U', | (not_dep,dep_nor), | false, | true) |
| D5 | (data, | 'U', | (not_dep,dep_nor), | false, | true) |
| C1 | (dontcare, | 'U', | (not_dep,not_dep), | false, | true) |
| C3 | (clock, | 'O', | (not_dep,dep_nor), | true, | true) |
| C4 | (dontcare, | 'U', | (not_dep,not_dep), | true, | true) |

The symbolictype dontcare is used to suppress follow-up error messages to an error. This state causes the following error messages being issued by the model.

Assertion NOTE at 200 NS in design unit STIM from process/SYNCEX/STIMGEN: "Protocol Phase 2."

Assertion NOTE at 200 NS in design unit AND_GATE from process/SYNCEX/B0/A3/P0: "Gate depends on signals in a combinational feedback loop or is contained in such a loop."

Assertion NOTE at 200 NS in design unit AND_GATE from process/SYNCEX/B0/A2/P0: "Gate depends on signals in a combinational feedback loop or is contained in a such a loop."

Assertion NOTE at 200 NS in design unit AND_GATE from process/SYNCEX/B0/A2/P0: "A clock signal is gated with a data signal that depends on the clock."

Other error types that can be detected but do not occur in the example are:

Clock edge found at the clock input to a flip-flop is inverse to the expected one.

A data signal is used as clock input to a flip-flop.

Data inputs of a gate depend both from the positive and the negative edge of the same clock.

Figure 4:
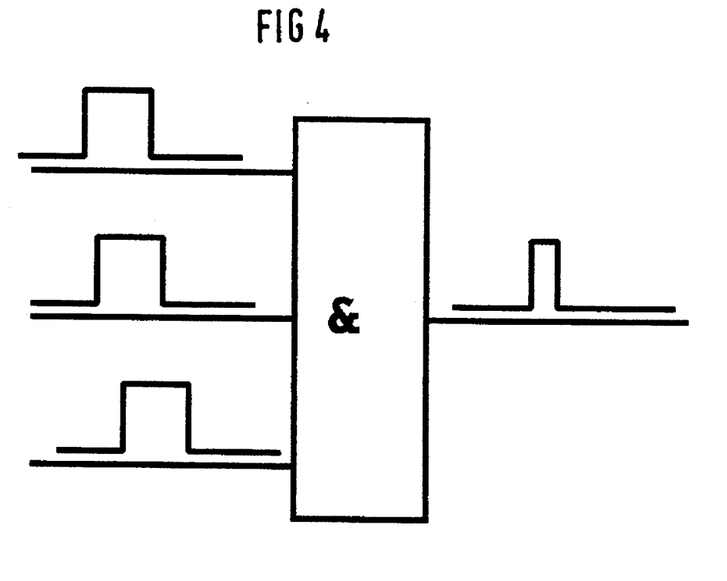
FIG. 4 shows an example of an illegal AND type composition of clock signals.

Illegal combination of multiple clocks, e.g., ANDing clocks with an active edge from '0' to '1'. In such a combination we need several simultaneous input clock pulses to generate a clock pulse at the output. The clock width of the resulting clock pulse then depends on the clock skew of the combined clocks and may be to short (see FIG. 4 for an example of such a problem).

Checking Rules for Modular Testing Support

The second application of our method is the verification of transfer paths for modular testing. This application was motivated by a system that we had built earlier to support modular test pattern generation for integrated circuits (RoJG89). To use this system, the designer has to describe the transfer paths in a simple language called BED (Block Environment Description). The BEDs contain the information how test patterns can be transported to the inputs of the module under test (MUT) from external inputs (pads) and how the responses of the MUT can be made visible at external outputs. Since these descriptions are handcrafted by the designer, it has to be verified whether the described transfer paths are truly transparent in the real circuit when the given control sequences are applied. The BED system only supports transfer paths that are bit-wise transparent. This makes it much easier to describe transfer paths since they are independent of the actual patterns that have to be transferred. Besides, this restriction is not too hard since most circuits contain data paths or busses that naturally have this property. Even modules like adders or multipliers provide such paths since a+0=a and a*1=a.

Figure 5:
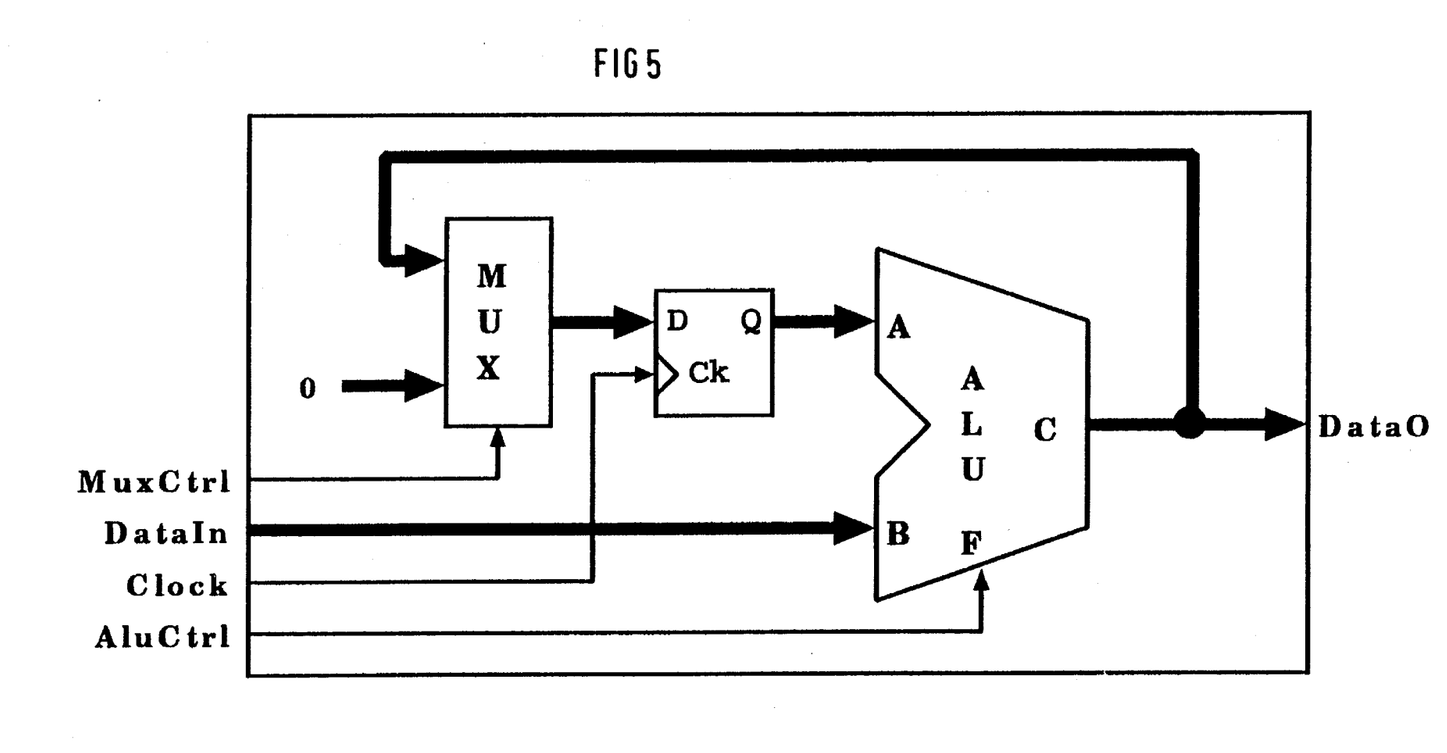
FIG. 5 shows an example suitable for the application of a block environment description (BED)

An example circuit containing an ALU and some sequential logic around it is shown in FIG. 5. To apply the test patterns that are available for the ALU from the external pins we perform the following procedure. FIG. 5 shows an example suitable for the application of BEDS (part of AM2901)

1. Set MuxCtrl such that the constant 0 is delivered at the output of the multiplexer.
2. Apply one clock cycle to the clock input.
3. Assign the test pattern to be transferred to input A of the ALU to DataIn.
4. Set AluCtrl to Addition. Thus the result at the output of the ALU is identical to the data at DataIn.
5. Set MuxCtrl such that the output of the ALU is fed to the data input of the register.
6. Store the value in the register with another clock cycle. After this clock cycle the pattern for the input A has reached the ALU.
7. Set DataIn and AluCtrl to the values from the test pattern for inputs B and F, respectively.
8. Observe the response of the ALU at DataOut.

Figure 6:
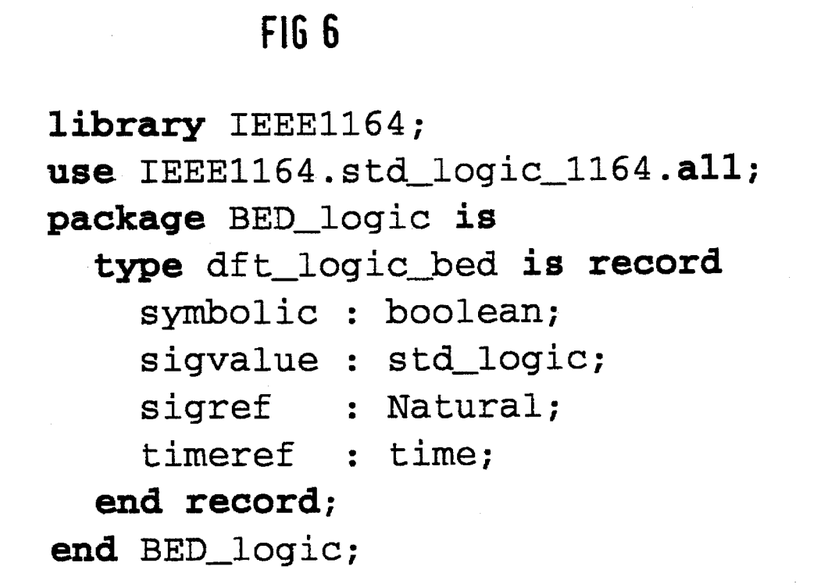
FIG. 6 shows the DFT-logic for the verification of transfer paths.

Now the task of a DFT rule checker is to verify that the above procedure really works for arbitrary ALU test patterns. The basic principle to do the check with a VHDL simulator is the same as before. We do, however, need another logic type for the verification (see FIG. 6). Our approach to check this type of rule has similarities to the one published in (CRSP89), but again we are using a standard simulator instead of a special purpose tool. In addition, our approach takes different time frames for each symbolic value into account, such that more accurate simulation is possible (see below). If symbolic is true the signal has a symbolic value. FIG. 6 shows a design for testability logic for the verification of transfer paths. The element sigref then contains a reference to the external pin at which the symbolic value was applied at the time in element timeref. In this case the value in sigvalue indicates whether the signal has the same or an inverted polarity as the external pin. If symbolic is false the value stored in sigvalue is interpreted as given by the IEEE-1164 standard and the elements sigref and timeref are irrelevant.

Based on this logic we have described the operators AND and NOT and derived all other operators from these. The "truth-table" for the and operator is defined as follows. A "*" (wildcard) denotes a don't care value. As explained above, a sigvalue of '1' for a symbolic value S denotes S.

1. If two non-symbolic values are combined the and operator of the std_logic is used to determine the resulting value.
   (false,V1,*,*) and (false,V2,*,*) results in (false,V1 and V2,0,0).
2. If a symbolic value is combined with a non-symbolic one we have the following cases:
   (a) (false,'1',*,*) and (true,V2,SR2,TR2) results in (true,V2,SR2,TR2), i.e., the and is transparent to any symbolic value.
   (b) (false,'0',*,*) and (true,*,*,*) results in (false,'0', 0,0), i.e., the and is blocking.
3. If two symbolic values are combined we have to distinguish the following cases:
   (a) (true,V1,SR1,TR1) and (true,V1,SR1,TR1) results in (true,V1,SR1,TR1), i.e., S and S results in S and S and S results in S.
   (b) (true,'0',SR1,TR1) and (true,'1',SR1,TR1) results in (false, '0',0,0), i.e., S and S results in 0.
   (c) All other combinations, e.g., the and of two different symbolic values or the and of the same symbolic value with different timeref result in (false,'X',0,0).

Figure 7A:
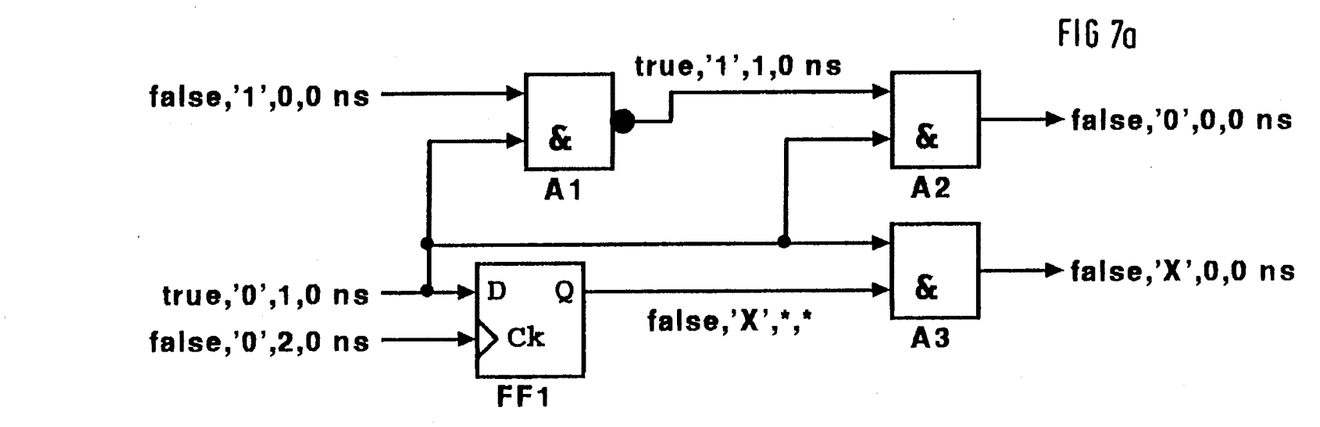
FIGS. 7a and 7b show examples of signal combinations during symbol simulation.
Figure 7B:
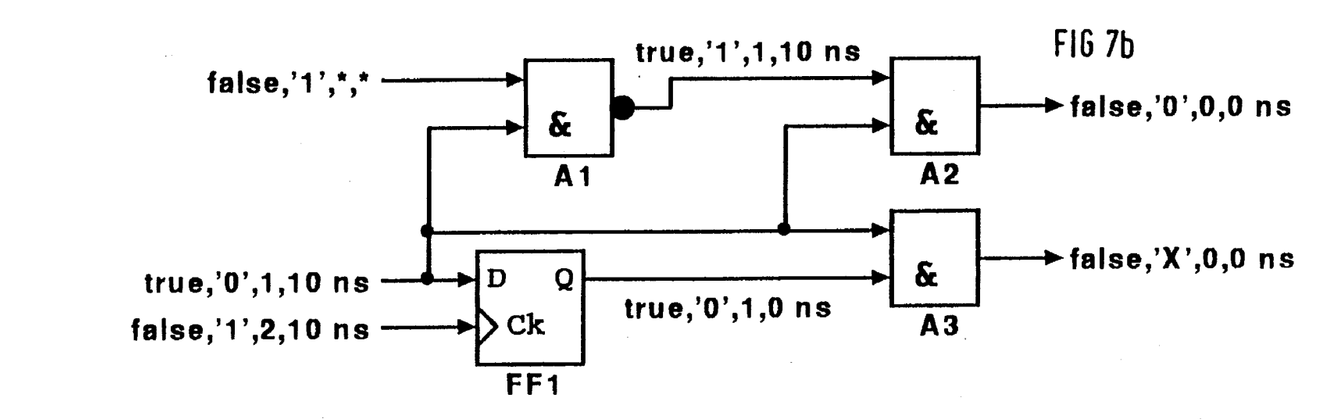

An example that illustrates several combinations is shown in FIG. 7. It shows the state of a circuit before (a) and after (b) a clock edge for FF1, and the effect of the timeref element in the logic. the AND-gate A3 produces an 'X' because the symbolic values refer to two different time frames. A2 produces a constant '0' because the inputs are the symbolic values S and S refer to the same time frame. FIG. 7 shows some examples of combinations during symbolic simulation.

Let us return to the check for the example from FIG. 5. It is performed in three phases.

1. The symbolic values are transported to the MUT.
2. The MUT has to check whether all of its inputs have correct symbolic values. All inputs have to be independent, i.e., no symbolic value may occur more than once at a module input. If all input checks have been passed, the MUT assigns symbolic values to its outputs. The ALU outputs get pin numbers that are unique across the whole circuit.
3. Every output of the MUT has to be transported to at least one external pin.

Figure 8:
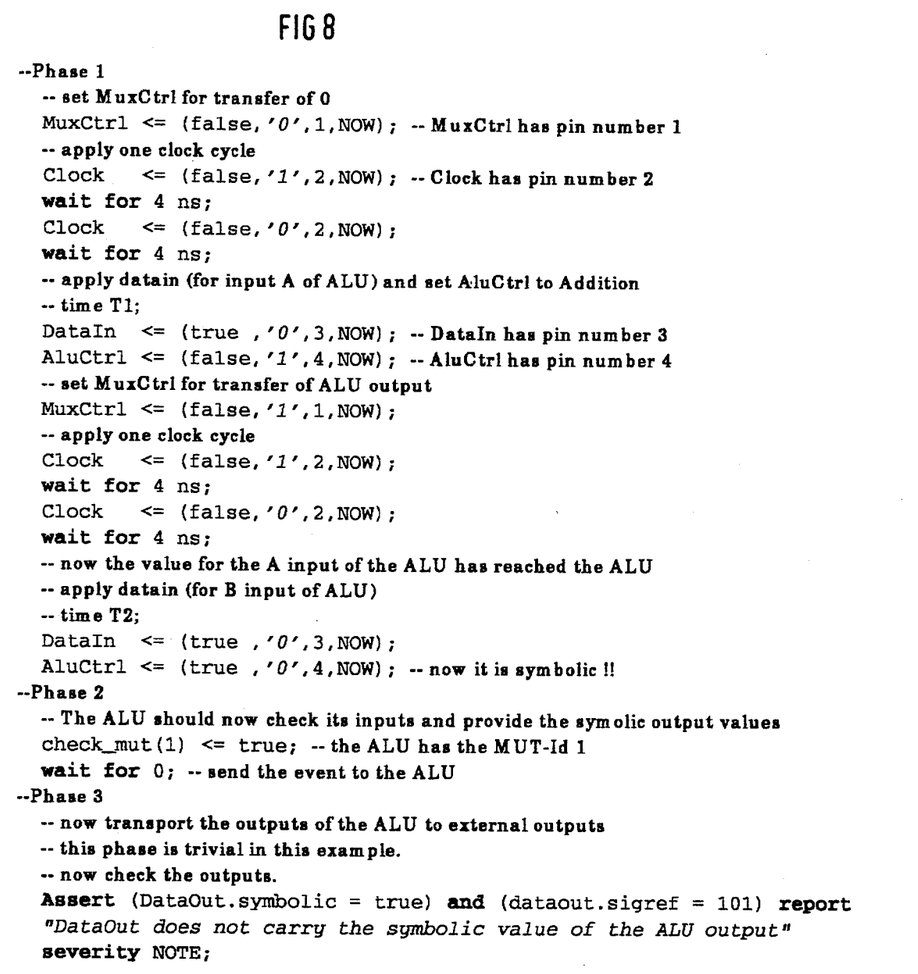
FIG. 8 shows stimuli which can be used to perform a check for example 5 of the detailed description.

The execution of these three phases in the VHDL simulator is controlled by corresponding stimuli. Stimuli for the above example are shown in FIG. 8.

Some remarks on the stimuli should help.

Every module has a unique MUT number. In hierarchical descriptions with multiple instantiations this can be achieved using generic constants.

A global signal array check_mut is used to switch the individual modules of a circuit from normal operation to the mode in which the checks at the inputs are performed and the outputs of the module get symbolic values. The VHDL descriptions of the MUTs have to be extended to be sensitive to this global signal and to switch between the two modes.

The VHDL standard function NOW is used to set the timeref element in every assignment.

The values found at the ALU in phase 2 are:
(true, '0',3,T1) for the input A (T1 is the time after the first clock cycle);
(true, '0',3,T2) for the input B (T2 is the time after the second clock cycle);
(true, '0',4,T2) for the input F.

This shows why we need to attribute the symbolic values with the time when they were applied at the external inputs using the timeref element of the logic.

The check at the primary outputs is done through VHDL's assertion statement.

The basic method described in the previous sections can be applied to other problems, too. Some of them are sketched below.

Levelizing

Levelizing means to "sort" a VHDL data flow description such that an expression is only evaluated after all of its factors have been evaluated. Concurrent signal assignments can then be turned into a sequential process which may result in a higher simulation performance, especially if local signals of an entity can be turned into variables. The logic for this task is based on a level number. All primary inputs are assigned level 0. Then each component "automatically" determines its level as the maximum level of its inputs plus 1.

Testability Measures

Several testability measures can be calculated for a circuit. Most popular are controllability and observability (Gold79) or probabilistic values as in (Wund85). Measures that can be calculated by forward3 passing of numerical values can easily be determined with a VHDL simulator. Measures that need values to be passed in the opposite direction, however, are more difficult since each unidirectional signal has to be turned into a signal that allows bidirectional flow of information. Besides, we also have to add resolution functions to resolve multiple senders.

Test Pattern Generation

Even test pattern generation is theoretically possible with the presented method. The components have to communicate with each other via messages such as "generate value v at your output/my input", "propagate value v to your output", or "resolve conflict, try another possibility". This has not been implemented, though, because the performance would be poor compared with dedicated automatic test pattern generators.

Type Checking

In the first application, signals were classified as data and clocks. We could refine this classification and distinguish, e.g., between address, control, and data signals. We could then check for combinations between different types of data.

Other DFT Rules

Some other testability related design rules can be checked with the method, including the following examples.

If a data signal that is an input to latch L1 is fed by latch L2, and the clock inputs of both latches depend from the same external clock, then there is a rule violation.

Correct construction of a scan path, e.g., correct connection from ScanIn to ScanOut or correct usage of ScanEnable.

Ease of initialization, e.g., reset inputs of storage elements may only be fed by external data that are combinations of external data.

Checking rules of the type "a circuit may never be in a state where . . ." requires tautology. This is similar to test pattern generation as described above. Because of the poor expected performance and the large effort for model development it makes no sense to check such rules without an approach. None of the approaches published on DFT rule checking is able to cover such types of rules either, though.

We have presented an approach to use a standard VHDL simulator for the DFT rule checking. For two types of rules we have explained the special logic that is needed and how the checks are performed. Both logic types that we defined can also be used for ordinary simulation, with some penalty in simulation performance due to the larger data structures associated with each signal or variable in the DFT logic. Symbolic simulation as shown in the second application is nevertheless attractive for circuit validation since a whole set of real stimuli can be covered by a single symbolic stimulus.

Currently, we have a specific logic for each rule, but we could combine those into a single "super" logic.

The method can be applied to VHDL data flow and structure descriptions and to processes that represent combinational logic. Processes that represent sequential logic have to be synthesized to a set of Boolean equations (VHDL data flow) and primitive storage elements like flip-flops or latches.

References (Bhav83) D. K. Bhavsar. Design For Test Calculus. An Algorithm for DFT Rule Checking. In Proceedings of the 20th ACM/IEEE Design Automation Conference (DAC), pages 300–307, 1983.

(Bidj91) M. Bidjan-lrani. ARule-basedDesign-For-Testability Rule Checker. IEEE Design & Test of Computers, March 1991.

(CRSP89) L. Carter, B. K. Rosen, G. L. Smith, and V. Pichumani. Restricted Symbolic Evaluation is Fast and Useful. In Proceedings of the International Conference on Computer Aided Design (ICCAD), pages 38–41, November 1989.

(Degr90) J. E. Degroat. Transparent Logic Modeling in VHDL. IEEE Design & Test of Computers, pages 42–48, June 1990.

(GoFB77) H. C. Godoy, G. B. Franklin, and P. S. Pottorf. Automatic Checking of Logic Design Structures for Compliance with Testability Ground Rules. In Proceedings of the 14th ACM/IEEE Design Automation Conference (DAC), pages 469–478, 1977.

(Gold79) L. H. Goldstein. Controllability/Observability Analysis of Digital Circuits. IEEE Transactions on Circuits and Systems, CAS-26, September 1979.

(KHOM90) Y. Koseko, C. Hiramine, T. Ogihara, and S. Mural. Rule-based Testability Rule Check Program. In Proceedings of the International Conference on Computer Design (ICCD), pages 95–98, 1990.

(KnTr89) R. Knopf and E. Trischler. CERBERUS: A Hierarchical DFT Rule Checker. In Proceedings of the European Test Conference (ETC), 1989.

(Pelz92) G. Pelz. An Interpreter for General Netlist Design Rule Checking. In Proceedings of the 29th ACM/IEEE Design Automation Conference (DAC), pages 305–310, 1992.

(RoJG89) W. Roth, M. Johansson, and W. Glunz. The BED Concept—A method and a Language for Modular Test Generation. In International Conference on VLSI (VLSI'89), 1989.

(Varm90) P. Varma. TDRC-A Symbolic Simulation Based Design for Testability Rules Checker. In Proceedings of the International Test Conference (ITC), pages 1055–1064, 1990.

(Wund85) H.-J. Wunderlich. PROTEST: A Tool for Probabilistic Testability Analysis. In Proceedings of the 22nd ACM/IEEE Design Automation Conference (DAS), 1985.

Although various minor changes and modifications might be suggested by those skilled in the art, it will be understood that I wish to include within the scope of the patent warranted hereon all such changes and modifications as reasonably come within my contribution to the art.

We claim as our invention:

1. A method for checking conformance of a digital circuit design with a given set of testability design rules, comprising the steps of:

building a circuit description of the digital circuit design to be checked using a circuit description language that permits use of a user defined, non-standard logic;

providing a circuit dependent sequence of stimuli using said circuit description language;

providing a simulator which builds up a simulation model when said circuit description is loaded into it;

applying the stimuli to the circuit description by loading the circuit description and the stimuli into the simulator and allowing the simulator to process the stimuli as applied to the circuit description until the simulator has no more events to process; and switching the simulator model into a check mode in which each component of the circuit checks a testability state and issues error messages if an illegal state was found.

2. A method according to claim 1 wherein VHDL is used as said circuit description language.

* * * * *